United States Patent
Yang et al.

(10) Patent No.: US 9,146,060 B2
(45) Date of Patent: Sep. 29, 2015

(54) HEAT-DISSIPATING DEVICE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Chih-Hao Yang, New Taipei (TW); Xiang-Kun Zeng, Shenzhen (CN); Er-Wei Lu, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/140,716

(22) Filed: Dec. 26, 2013

(65) Prior Publication Data

US 2014/0338881 A1 Nov. 20, 2014

(30) Foreign Application Priority Data

May 16, 2013 (CN) .......................... 2013 1 01808209

(51) Int. Cl.
*H05K 7/20* (2006.01)
*F28F 5/00* (2006.01)
*H02K 33/18* (2006.01)

(52) U.S. Cl.
CPC *F28F 5/00* (2013.01); *H02K 33/18* (2013.01); *H05K 7/20136* (2013.01)

(58) Field of Classification Search
CPC .......... H05K 7/20136; H05K 7/20145; H05K 7/20154; H05K 7/2039; F04F 33/00; F28F 5/00; H02K 33/06; H02K 33/16; H02K 33/18
See application file for complete search history.

(56) References Cited

U.S. PATENT DOCUMENTS

| 4,507,579 | A  | * | 3/1985 | Turner | 310/23 |
| 2008/0286133 | A1 | * | 11/2008 | He et al. | 417/415 |
| 2014/0146470 | A1 | * | 5/2014 | Yang et al. | 361/694 |
| 2015/0091395 | A1 | * | 4/2015 | Spivak | 310/20 |
| 2015/0091479 | A1 | * | 4/2015 | Spivak | 318/139 |

* cited by examiner

*Primary Examiner* — Robert J Hoffberg
(74) *Attorney, Agent, or Firm* — Novak Druce Connolly Bove + Quigg LLP

(57) ABSTRACT

A heat-dissipating device includes a receiving tray, a driving module, a plunger, and a heat-dissipating member. A first holding valve assembly and a second holding valve assembly are located on the receiving tray. The driving module includes a first magnet. The plunger includes a second magnet. The receiving tray is divided into a first ventilation area and a second ventilation area. The plunger is moveable in the receiving tray by magnetic forces between the first magnet and the second magnet. Air outside of the receiving tray flows through the first and second ventilation areas via the first holding valve assembly and the second holding valve assembly.

18 Claims, 5 Drawing Sheets

HEAT-DISSIPATING DEVICE

BACKGROUND

1. Technical Field

The present disclosure relates to heat-dissipating apparatuses.

2. Description of Related Art

With the development of technology, electronic devices are becoming thinner and smaller while containing more and more electronic components. However, the electronic components generate large amounts of heat during operation. A heat dissipation module, such as a fan, is used in the electronic device for dissipating the heat. However, an air inlet and an air outlet of the fan cannot be changed, which adversely affects heat dissipation efficiency of the fan. Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
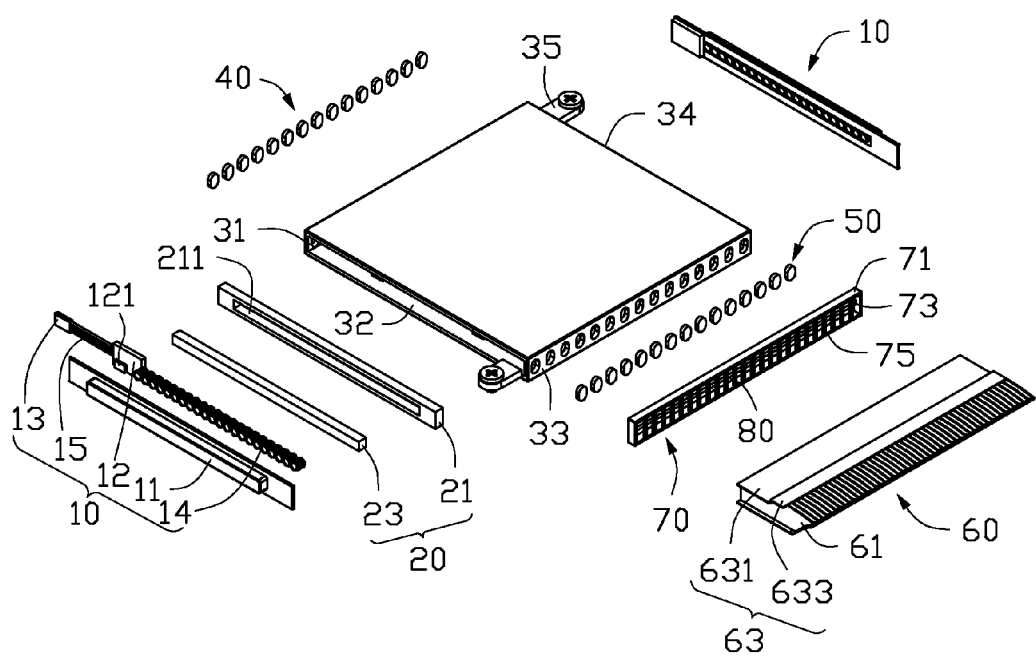
FIG. 1 is an exploded, isometric view of an embodiment of a heat-dissipating device.

FIG. 1 illustrates an embodiment of a heat-dissipating device. The heat-dissipating device comprises two driving modules 10, a plunger 20, a receiving tray 30 receiving the plunger 20, a first holding valve assembly 40, a second holding valve assembly 50, a heat-dissipating member 60, and a commutating fence 70 attached to the heat-dissipating member 60.

Each driving module 10 comprises a bracket 11, a control circuit board 12, a connector 13, and a first magnet 14 attached to the bracket 11. The control circuit board 12 is connected to the first magnet 14 to supply electric current to the first magnet 14. In one embodiment, the first magnet 14 is an electromagnet. The connector 13 is connected to the control circuit board 12 by a cable 15. The connector 13 is used to connect to a power supply of a motherboard (not shown). A sensor 121 is located on the circuit board 12 and used to detect a location of the plunger 20 in the receiving tray 30.

The plunger 20 comprises a securing tray 21 and a second magnet 23. The securing tray 21 defines a securing slot 211 for receiving the second magnet 23. In one embodiment, the second magnet 23 is a permanent magnet.

The receiving tray 30 comprises a first side plate 31 and a second side plate 33 opposite to the first side plate 31. The receiving tray 30 further comprises a first end 32 and a second end 34 opposite to the first end 32. The first end 32 is substantially perpendicular to the first side plate 31. Two mounting plates 35 extend from the receiving tray 30 and are used to secure the receiving tray 30 to the motherboard.

Each of the first holding valve assembly 40 and the second holding valve assembly 50 comprises a plurality of holding valves arranged in a substantially linear fashion.

The heat-dissipating member 60 comprises a plurality of first fins 61 and a second fin 63. The second fin 63 comprises a first guiding portion 631 and a second guiding portion 633 connected to the first guiding portion 631. In one embodiment, the second guiding portion 633 is located above the first guiding portion 631, and the second guiding portion 633 is substantially parallel to the first guiding portion 631.

The commutating fence 70 comprises a frame 71, a first connecting panel 73, and a plurality of second connecting panels 75. The second connecting panels 75 are substantially parallel to each other and substantially perpendicular to the first connecting panel 73. A plurality of through holes 80 is defined by the first connecting panel 73 and the plurality of second connecting panels 75.

Figure 2:
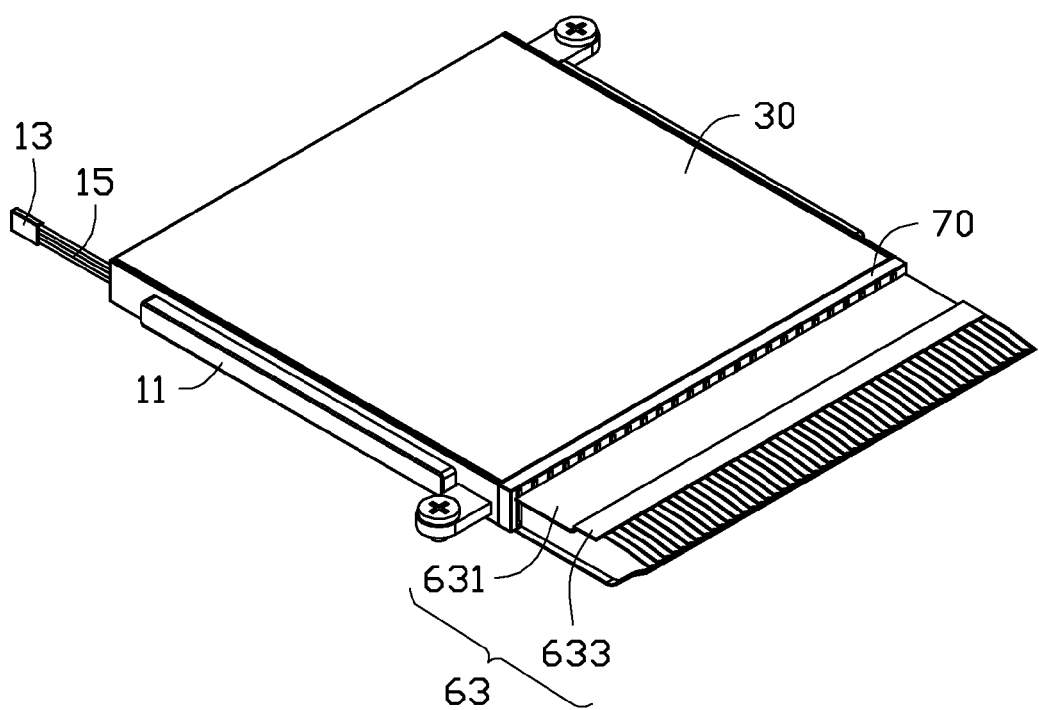
FIG. 2 is an assembled view of the heat-dissipating device of FIG. 1.
Figure 3:
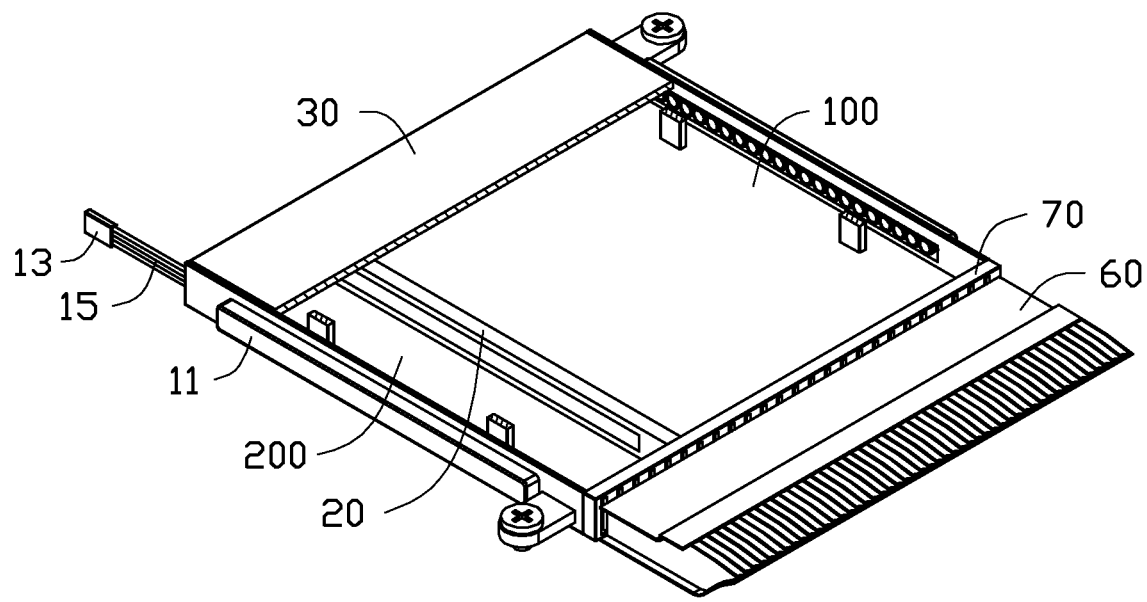
FIG. 3 is similar to FIG. 2, but partially cutaway to show a receiving tray of the heat-dissipating device.

FIGS. 2-3 shows that in assembly, the plunger 20 is received in the receiving tray 30. The two driving modules 10 are secured to the corresponding first end 32 or the second end 34 by screws or other suitable mounting means. The first holding valve assembly 40 is attached to the first side plate 31, and the second holding valve assembly 50 is attached to the second side plate 33. The commutating fence 70 is secured to the second side plate 33 and the heat-dissipating member 60 by screws or other suitable mounting means. The plunger 20 divides an interior space of the receiving tray 30 into a first ventilation area 100 and a second ventilation area 200. The plunger 20 also divides the first holding valve assembly 40 into a first section 41 and a second section 43, and divides the second holding valve assembly 40 into a third section 51 and a fourth section 53. The first section 41 and the third section 51 are located at opposite ends of the first ventilation area 100, and the second section 43 and the fourth section 53 are located at opposite ends of the second ventilation area 200.

Figure 4:
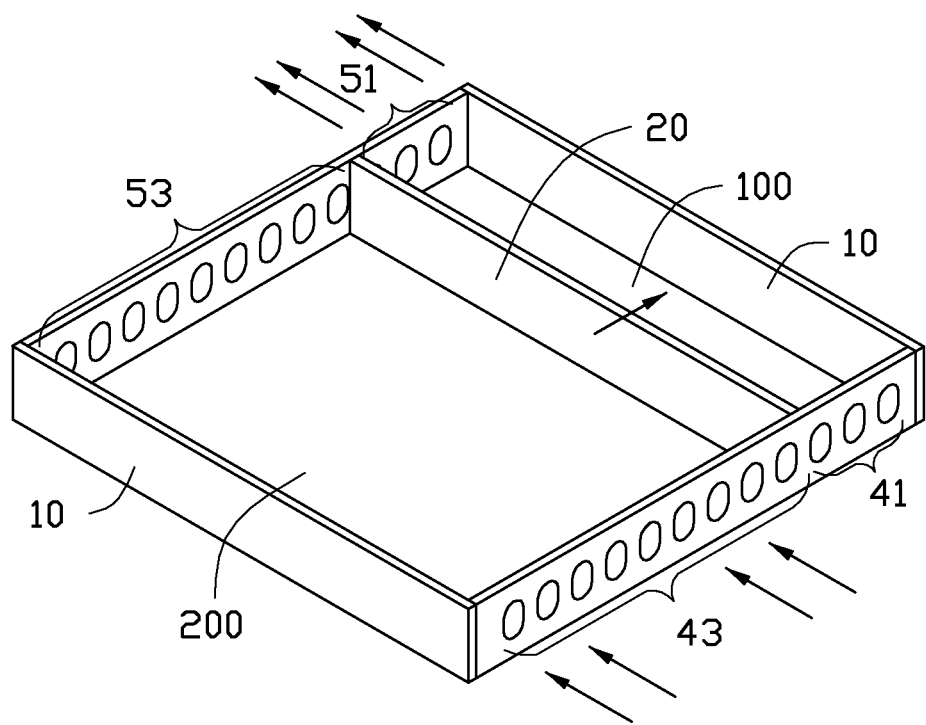
FIG. 4 is a schematic diagram of the heat-dissipating device in a first state of use.

FIG. 4 shows that the plunger 20 is located in a first position. In the first position, the plunger 20 can abut the first end 32, The sensor 121 senses the plunger 20 is in the first position, and the control circuit board 12 supplies a first current flowing along a first direction to the two first magnets 14. At this time, a magnetic pole of the first magnets 14 is the same as a magnetic pole of the second magnet 23. Thus, the plunger 20 is pushed toward the second end 34. The magnetic pole of the first magnets 14 at the second end 34 is opposite to the magnetic pole of the second magnet 23. Thus, the plunger 20 is pulled toward the second end 34. When the plunger 20 is moving in the receiving tray 30 and towards the second end 34, a positive pressure is created in the first ventilation area 100. Each valve of the holding valves of the first section 41 is closed, and each valve of the holding valves of the third section 51 is open. Thus, air in the first ventilation area 100 can flow out of the first ventilation area 100 via the holding valves of the third section 51. Simultaneously, a negative pressure is created in the second ventilation area 200. Each valve of the holding valves of the fourth section 53 is closed, and each valve of the holding valves of the second section 43 is open. Thus, air can flow into the second ventilation area 200 via the holding valves of the second section 43.

Figure 5:
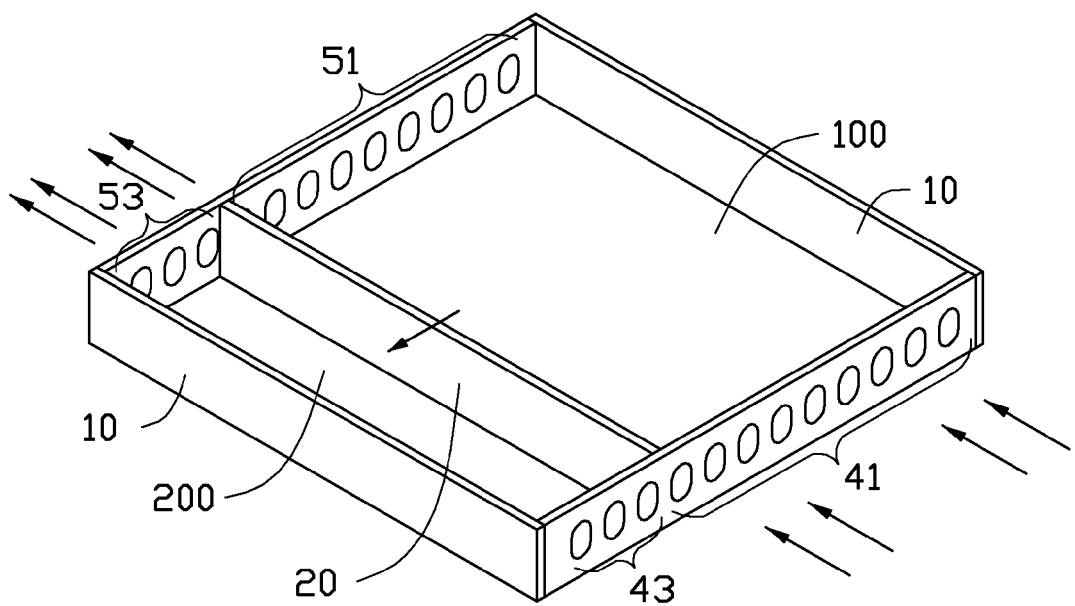
FIG. 5 is similar to FIG. 4, but shows the heat-dissipating device in a second state of use.

FIG. 5 shows that the plunger 20 is located in a second position. In the second position, the plunger 20 can abut the second end 32. The sensor 121 senses that the plunger 20 is in the second position, and the control circuit board 12 supplies a second current flowing along a second direction opposite to the first direction to the two first magnets 14. At this time, the magnetic pole of the first magnets 14 at the first end 32 is opposite to the magnetic pole of the second magnet 23, so the plunger 20 is pulled away from the second end 34. The magnetic pole of the first magnets 14 at the second end 34 is the same as the magnetic pole of the second magnet 23, so the plunger 20 is pushed away from the second end 34. When the plunger 20 is moving in the receiving tray 20 and towards the first end 32, a negative pressure is created in the first ventilation area 100. Each valve of the holding valves of the first section 41 is open, and each valve of the holding valves of the third section 51 is closed. Thus, air can flow into the first ventilation area 100 via the holding valves of the first section 41. Simultaneously, a positive pressure is created in the second ventilation area 200. Each valve of the holding valves of the fourth section 53 is open, and each valve of the holding valves of the second section 43 is closed. Thus, air in the second ventilation area 200 can flow out of the second ventilation area 200 via the holding valves of the fourth section 53.

The commutating fence 70 is located between the second side plate 33 and the heat-dissipating member 60. Thus, air flowing through the third section 51 and the fourth section 53 is commutated by the commutating fence 70 and evenly flows through the heat-dissipating member 60.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A heat-dissipating device comprising:
   a receiving tray;
   a first holding valve assembly and a second holding valve assembly located on opposite sides of the receiving tray;
   a driving module attached to the receiving tray on a side of the receiving tray between the first holding valve assembly and the second holding valve assembly, the driving module comprising a first magnet;
   a plunger moveably received in the receiving tray and comprising a second magnet, the receiving tray is divided to a first ventilation area and a second ventilation area by the plunger; and
   a heat-dissipating member attached to the receiving tray adjacent to at least one of the first holding valve assembly or the second holding valve assembly;
   wherein the plunger is moveable relative to the receiving tray between a first position and a second position, when in the first position, a same magnetic pole is defined between the first magnet and the second magnet, to push the plunger away from the driving module, when in the second position, an opposite magnetic pole is defined between the first magnet and the second magnet, to pull the plunger towards the driving module, and air outside of the receiving tray flows through the first and second ventilation areas via the first holding valve assembly and the second holding valve assembly.

2. The heat-dissipating device of claim 1, wherein a moveable direction of the plunger is substantially perpendicular to a flowing direction of the air.

3. The heat-dissipating device of claim 1, wherein the first magnet is an electromagnet, and the second magnet is a permanent magnet.

4. The heat-dissipating device of claim 1, wherein the first holding valve assembly comprises a plurality of first holding valves, the plurality of first holding valves is divided to a first section located in the first ventilation area and a second section located in the second ventilation area; when the same magnetic pole is defined between the first magnet and the second magnet, the valves of the first section are open, the valves of the second section are closed, and the air flows into the first ventilation area via the valves of the first section; when the opposite magnetic pole is defined between the first magnet and the second magnet, the valves of the first section is closed, the valves of the second section is open, and the air flows into the second ventilation area via the valves of the second section.

5. The heat-dissipating device of claim 4, wherein the second holding valve assembly comprises a plurality of second holding valves, the plurality of second holding valves is divided to a third section located in the first ventilation area and a fourth section located in the second ventilation area; when the valves of the first section are open and the valves of the second section are closed, the valves of the third section are closed, the valves of the fourth section are open, and the air in the second ventilation area flows in to the heat-dissipating member via the valves of the fourth section; and when the valves of the fourth section are closed, the valves of the third section are open, and the air in the first ventilation area flows in the heat-dissipating member via the valves of the third section.

6. The heat-dissipating device of claim 5, wherein the receiving tray comprises a first side plate and a second side plate opposite to the first side plate, the first holding valve assembly is secured to the first side plate, and the second holding valve assembly is secured to the second side plate.

7. The heat-dissipating device of claim 1, wherein the driving module further comprises a control circuit board connected to the first magnet, and the control circuit board is configured to change a direction of a current flowing along the first magnet, to change a magnetic pole of the first magnet.

8. The heat-dissipating device of claim 7, wherein the driving module further comprises a sensor secured to the control circuit board, the sensor is configured to sense a position of the plunger in the receiving tray and send a controlling signal to the control circuit board.

9. The heat-dissipating device of claim 1, further comprising a commutating fence, wherein the air out of the receiving tray is commutated by the commutating fence to flow into the heat-dissipating member.

10. A heat-dissipating device comprising:
    a receiving tray;
    a first holding valve assembly and a second holding valve assembly located on opposite sides of the receiving tray;
    a driving module attached to the receiving tray on a side of the receiving tray between the first holding valve assembly and the second holding valve assembly, the driving module comprising a first magnet and a control circuit board connected to the first magnet, the first magnet comprising a first magnetic pole;
    a plunger moveably received in the receiving tray and comprising a second magnet; the receiving tray is divided to a first ventilation area and a second ventilation area by the plunger; the second magnet comprising a second magnetic pole; and a heat-dissipating member attached to the receiving tray adjacent to at least one of the first holding valve assembly or the second holding valve assembly;

wherein the control circuit board is configured to change a direction of a current flowing along the first magnet, to change the first magnetic pole of the first magnet, when the first magnetic pole of the first magnet is same to the second magnetic pole of the second magnet, the plunger is pushed away from the driving module, when the first magnetic pole of the first magnet is opposite to the second magnetic pole of the second magnet, the plunger is pulled towards the driving module, and air outside of the receiving tray flows through the first and second ventilation areas via the first holding valve assembly and the second holding valve assembly.

11. The heat-dissipating device of claim 10, wherein a moveable direction of the plunger is substantially perpendicular to a flowing direction of the air.

12. The heat-dissipating device of claim 10, wherein the first magnet is an electromagnet, and the second magnet is a permanent magnet.

13. The heat-dissipating device of claim 10, wherein the first holding valve assembly comprises a plurality of first holding valves, the plurality of first holding valves is divided to a first section located in the first ventilation area and a second section located in the second ventilation area; when the first magnetic pole of the first magnet is the same to the second magnetic pole of the second magnet, the valves of the first section are open, the valves of the second section are closed, and the air flows into the first ventilation area via the valves of the first section; when the first magnetic pole of the first magnet is the opposite to the second magnetic pole of the second magnet, the valves of the first section are closed, the valves of the second section are open, and the air flows into the second ventilation area via the valves of the second section.

14. The heat-dissipating device of claim 13, wherein the second holding valve assembly comprises a plurality of second holding valves, the plurality of second holding valves is divided to a third section located in the first ventilation area and a fourth section located in the second ventilation area; when the valves of the first section is open and the valves of the second section is closed, the valves of the third section is closed, the valves of the fourth section is open, and the air in the second ventilation area flows in to the heat-dissipating member via the valves of the fourth section; and when the valves of the fourth section is closed, the valves of the third section is open, and the air in the first ventilation area flows in the heat-dissipating member via the valves of the third section.

15. The heat-dissipating device of claim 14, wherein the receiving tray comprises a first side plate and a second side plate opposite to the first side plate, the first holding valve assembly is secured to the first side plate, and the second holding valve assembly is secured to the second side plate.

16. The heat-dissipating device of claim 10, wherein the control circuit board is configured to change a direction of a current flowing along the first magnet, to change a magnetic pole of the first magnet.

17. The heat-dissipating device of claim 16, wherein the driving module further comprises a sensor secured to the control circuit board, the sensor is configured to sense a position of the plunger in the receiving tray and send a controlling signal to the control circuit board.

18. The heat-dissipating device of claim 10, further comprising a commutating fence, wherein the air out of the receiving tray is commutated by the commutating fence to flow into the heat-dissipating member.

* * * * *